(12) United States Patent
Zhang et al.

(10) Patent No.: US 12,185,565 B2
(45) Date of Patent: Dec. 31, 2024

(54) DISPLAY PANEL INCLUDING ENCAPSULATION PROTECTION STRUCTURE SURROUNDING DISPLAY AREA FOR IMPROVING ENCAPSULATION RELIABILITY, METHOD FOR PREPARING THE SAME, AND DISPLAY DEVICE

(71) Applicant: BOE TECHNOLOGY GROUP CO., LTD., Beijing (CN)

(72) Inventors: Kui Zhang, Beijing (CN); Li Liu, Beijing (CN); Pengcheng Lu, Beijing (CN); Yunlong Li, Beijing (CN); Dacheng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 984 days.

(21) Appl. No.: 17/258,614

(22) PCT Filed: Mar. 31, 2020

(86) PCT No.: PCT/CN2020/082470
§ 371 (c)(1),
(2) Date: Jan. 7, 2021

(87) PCT Pub. No.: WO2021/195973
PCT Pub. Date: Oct. 7, 2021

(65) Prior Publication Data
US 2021/0305535 A1    Sep. 30, 2021

(51) Int. Cl.
*H10K 50/844*    (2023.01)
*H10K 59/38*    (2023.01)
*H10K 71/00*    (2023.01)

(52) U.S. Cl.
CPC ........... *H10K 50/844* (2023.02); *H10K 59/38* (2023.02); *H10K 71/00* (2023.02)

(58) Field of Classification Search
CPC ............. H10K 50/841; H10K 50/8426; H10K 50/844; H10K 59/1201; H10K 59/1213;
(Continued)

(56) References Cited

U.S. PATENT DOCUMENTS

2007/0080356 A1    4/2007    Nakayama et al.
2011/0248626 A1    10/2011    Matsudate et al.
(Continued)

FOREIGN PATENT DOCUMENTS

| CN | 1917725 A | 2/2007 |
|---|---|---|
| CN | 104576685 A | 4/2015 |

(Continued)

OTHER PUBLICATIONS

"Transition." Merriam-Webster.com Dictionary, Merriam-Webster, https://www.merriam-webster.com/dictionary/transition. Accessed Nov. 16, 2023. (Year: 2023).*

(Continued)

*Primary Examiner* — Matthew E. Gordon
(74) *Attorney, Agent, or Firm* — Muncy, Geissler, Olds & Lowe, P.C.

(57) ABSTRACT

The present disclosure provides a display panel, a method for preparing the same, and a display device. The display panel includes: a display substrate, including a base substrate, a driving transistor embedded on the base substrate, and a first electrode layer located on the base substrate; an encapsulation protection structure located on the display substrate and surrounding a display area of the display substrate; a light emitting layer located on a surface of the first electrode layer away from the base substrate; a second electrode layer located on a surface of the light emitting layer away from the base substrate; and a first encapsulation layer located on a surface of the second electrode layer away from the base substrate.

7 Claims, 4 Drawing Sheets

(58) Field of Classification Search
CPC ............... H10K 59/131; H10K 59/871; H10K 59/8722; H10K 71/00; H10K 71/40; H10K 71/421; H10K 71/441
USPC .......................................................... 257/40
See application file for complete search history.

(56) References Cited

U.S. PATENT DOCUMENTS

| | | |
|---|---|---|
| 2015/0115234 A1 | 4/2015 | Hong |
| 2016/0164030 A1* | 6/2016 | Yasuda ............... G02F 1/13458 349/122 |
| 2020/0194733 A1 | 6/2020 | Sun et al. |
| 2020/0350512 A1 | 11/2020 | Guo et al. |

FOREIGN PATENT DOCUMENTS

| | | | |
|---|---|---|---|
| CN | 105379422 | A | 3/2016 |
| CN | 107845645 | A | 3/2018 |
| CN | 107885390 | A | 4/2018 |
| CN | 109599427 | A | 4/2019 |
| CN | 110061043 | A | 7/2019 |
| CN | 110212091 | A | 9/2019 |
| CN | 110838559 | A | 2/2020 |

OTHER PUBLICATIONS

Office Action mailed Sep. 15, 2022 in CN Application No. 202080000440.0, 11 pages, w/English-language translation.

* cited by examiner

DISPLAY PANEL INCLUDING ENCAPSULATION PROTECTION STRUCTURE SURROUNDING DISPLAY AREA FOR IMPROVING ENCAPSULATION RELIABILITY, METHOD FOR PREPARING THE SAME, AND DISPLAY DEVICE

TECHNICAL FIELD

The present disclosure relates to the field of display technology, in particular to a display panel, a method for preparing the same, and a display device.

BACKGROUND

Silicon-based organic light-emitting diodes are microdisplays developed in recent years. With mature silicon-based semiconductor manufacturing processes, organic light emitting diode displays with high display density and high refresh rate can be prepared for use in virtual reality or augmented reality field.

SUMMARY

The embodiment of the present disclosure provides a display panel, a method for preparing the same, and a display device.

In one aspect, a display panel is provided, including:
a display substrate, the display substrate including a base substrate, a driving transistor embedded on the base substrate, and a first electrode layer located on the base substrate and connected to a first electrode of the driving transistor;
an encapsulation protection structure located on the display substrate and surrounding a display area of the display substrate;
a light emitting layer located on a surface of the first electrode layer away from the base substrate;
a second electrode layer located on a surface of the light emitting layer away from the base substrate; and
a first encapsulation layer located on a surface of the second electrode layer away from the base substrate.

In some embodiments, a width of the encapsulation protection structure in a first direction is greater than 1 μm, and the first direction is perpendicular to an extension direction of the encapsulation protection structure and parallel to the base substrate.

In some embodiments, a minimum distance between an inner contour of an orthogonal projection of the encapsulation protection structure on the base substrate and an outer contour of an orthogonal projection of the display area on the base substrate is in a range from 100 μm to 200 μm.

In some embodiments, a thickness of the encapsulation protection structure is in a range from 0.5 μm to 2.5 μm.

In some embodiments, the encapsulation protection structure is made of a photoresist.

In some embodiments, the display panel further includes:
a color filter layer located on a surface of the first encapsulation layer away from the base substrate;
a second encapsulation layer located on a surface of the color filter layer away from the base substrate; and
an encapsulation cover plate located on a surface of the second encapsulation layer away from the base substrate.

An embodiment of the present disclosure further provides a display device including the display panel as described above.

An embodiment of the present disclosure further provides a method for preparing a display panel, including:
providing a display substrate, the display substrate including a base substrate, a driving transistor embedded on the base substrate, and a first electrode layer located on the base substrate and connected to a first electrode of the driving transistor;
forming an encapsulation protection structure surrounding a display area of the display substrate and an intermediate process structure comprising a photoresist covering a binding area of the display substrate;
forming a light emitting layer covering the display area;
forming a second electrode layer covering the display area;
forming a first encapsulation layer covering the display area and the binding area; and
burning the intermediate process structure comprising the photoresist by a laser, such that the intermediate process structure comprising the photoresist explodes to expose the binding area after absorbing heat.

In some embodiments, after the forming the first encapsulation layer, and before the burning the intermediate process structure comprising the photoresist by the laser, the method further includes:
forming a color filter layer covering the display area; and
forming a second encapsulation layer covering the display area and the binding area.

In some embodiments, the forming the encapsulation protection structure and the intermediate process structure comprising the photoresist includes:
forming the encapsulation protection structure and the intermediate process structure comprising the photoresist through a single patterning process.

In some embodiments, the intermediate process structure comprising the photoresist and the encapsulation protection structure are configured into an integral structure.

In some embodiments, a first orthogonal projection of the binding area on the base substrate is located within a second orthogonal projection of the intermediate process structure comprising the photoresist on the base substrate, and a minimum distance between an outer contour of the first orthogonal projection and an outer contour of the second orthogonal projection is in a range from 5 μm to 10 μm.

In some embodiments, a wavelength of the laser is in a range from 235 nm to 550 nm.

In some embodiments, a first orthogonal projection of the binding area on the base substrate is located within a spot of the laser, and a minimum distance between an outer contour of the first orthogonal projection and an outer contour of the spot is in a range from 5 μm to 10 μm.

DETAILED DESCRIPTION

In order to make the technical problems to be solved, the technical solutions, and the advantages of the examples of the present disclosure, the present disclosure will be described hereinafter in conjunction with the drawings and specific examples.

The process for preparing a silicon-based OLED (organic light emitting diode) display device is divided into a front stage and a latter stage. The front stage is to prepare the first electrode layer of the OLED display device on the base substrate, to obtain the display substrate; and the latter stage is to prepare the light emitting layer, the second electrode layer, the encapsulation layer, the color filter layer and the encapsulation cover plate, etc., on the display substrate, and to bind the PCB (printed circuit board) and/or FPC (flexible circuit board) to the display substrate.

Figure 1:
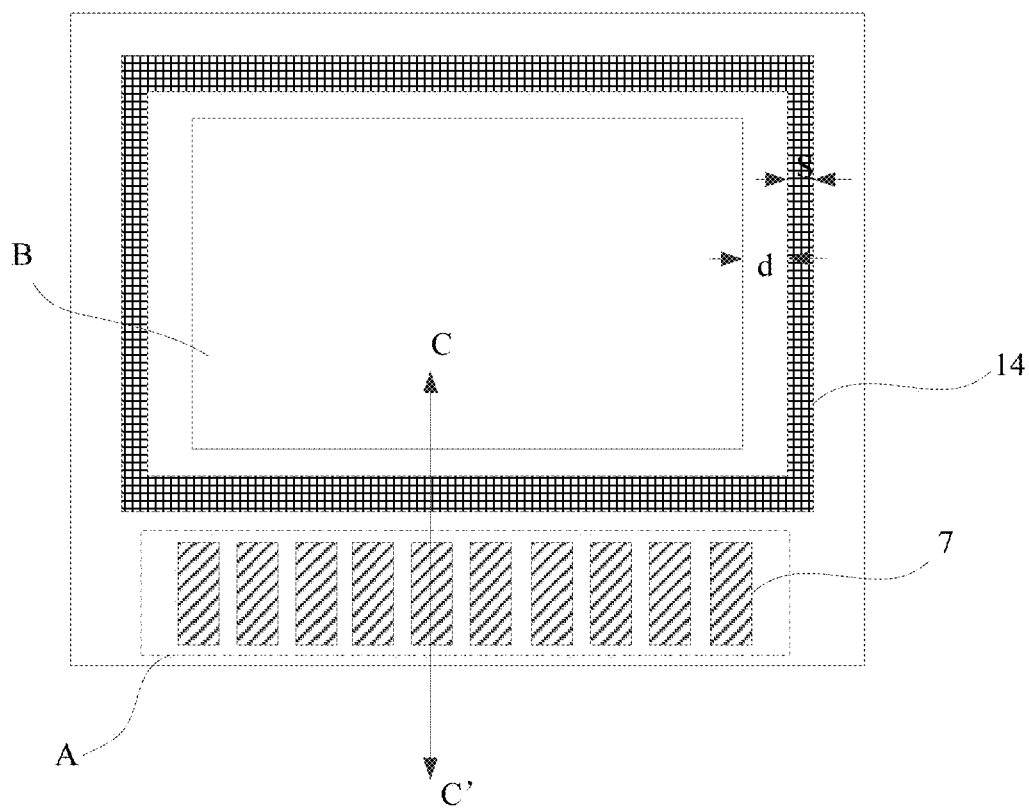
FIG. 1 is a schematic plan view showing a display panel according to an embodiment of the present disclosure.

Among them, in order to realize the binding of the PCB and/or FPC with the display substrate, the binding pins of the display substrate need to be exposed. As shown in FIG. 1, the display substrate includes a base substrate 1 and a multi-layer metal lead arranged on the base substrate 1, in which reference number 6 refers to the first metal lead layer farthest from the base substrate 1, and the first metal lead layer 6 includes binding pins 7 located in binding area A. Since the pixel size of the display device is very small, the light emitting layer and the encapsulation layer are prepared on the entire surface in the production of the latter stage, and the encapsulation layer for encapsulating the display panel will cover the display area and the binding area of the display substrate. However, during the subsequent PCB and/or FPC binding, the pins of the binding area need to be exposed, and before the binding, the encapsulation layer of the binding area needs to be removed.

In order to remove the encapsulation layer in the binding area before the binding, a photoresist covering the binding area can be formed before the light emitting layer is evaporated, and the photoresist is burned by laser after the encapsulation layer is formed. Since the photoresist has strong absorption to the laser, the photoresist explodes after absorbing the heat of the laser, thereby exposing the pins in the binding area, however, there will be photoresist residue at the edge of the area burned by the laser, thereby affecting the compactness of the encapsulation. In addition, at the edge of the area burned by the laser, the original encapsulation layer is affected to produce cracks, which is not conducive to water and oxygen isolation, and also affects the compactness of the encapsulation.

The embodiments of the present disclosure provide a display panel, a method for preparing the same, and a display device, which are capable of ensuring the encapsulation compactness of the display panel and improving the service life of the display panel.

Figure 7:
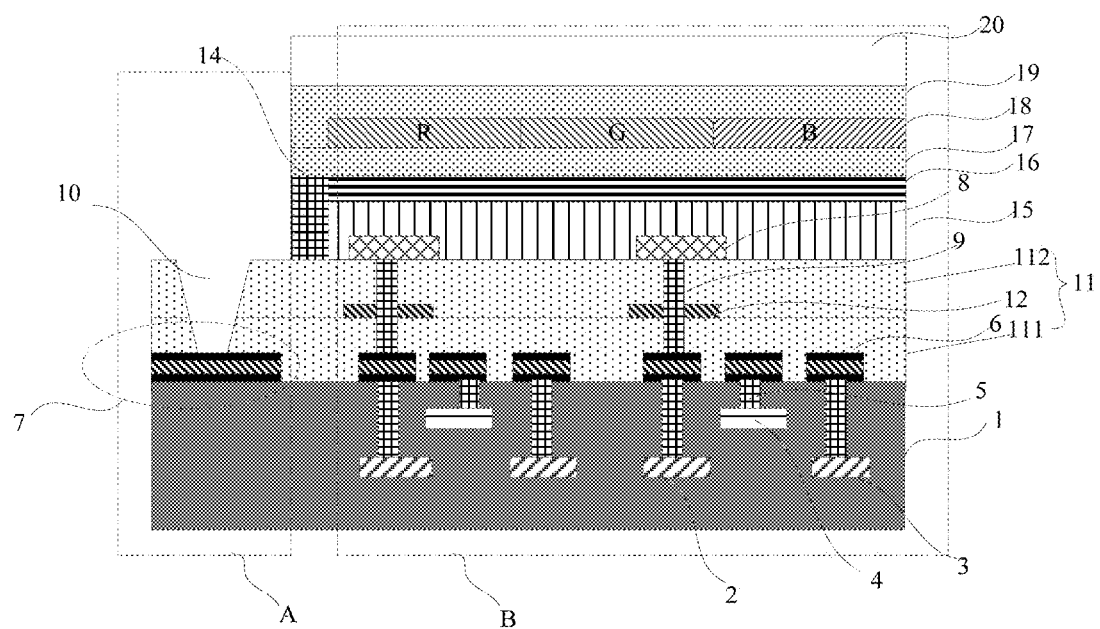

The embodiments of the present disclosure provide a display panel, as shown in FIGS. 1 and 7 (FIG. 7 is a schematic cross-sectional view of FIG. 1 in the CC direction), including:
 a display substrate, in which the display substrate includes a base substrate 1, a driving transistor embedded on the base substrate 1, and a first electrode layer located on the base substrate 1, the first electrode layer includes a plurality of mutually independent anode patterns 8 and connects to a first electrode of the driving transistor;
 an encapsulation protection structure 14 located on the display substrate and surrounding the display area B of the display substrate;
 a light emitting layer 15 located on a surface of the first electrode layer away from the base substrate 1;
 a second electrode layer 16 located on a surface of the light emitting layer 15 away from the base substrate 1; and
 a first encapsulation layer 17 located on a surface of the second electrode layer 16 away from the base substrate 1.

As shown in FIG. 7, a driving transistor is provided in the base substrate 1, in which reference number 2 refers to the source electrode of the driving transistor and reference number 3 refers to the drain electrode of the driving transistor. A multi-layer metal lead and an insulation layer 11 covering the multi-layer metal lead are formed on the base substrate 1. FIG. 7 only shows the first metal lead layer 6 furthest from the base substrate 1, in which the first metal lead layer 6 is connected to the source electrode 2, the drain electrode 3 and the polysilicon gate electrode 4 of the driving transistor through the electrically conductive connecting line 5. The polysilicon gate electrode 4 is one layer of polysilicon grown by the treatment of molecular beam epitaxy, which is conductive and can be used as the gate electrode of the thin film transistor. The first electrode layer is connected to the first electrode of the driving transistor through the first metal lead layer 6, in which the first electrode may be the source electrode 2, the drain electrode 3 and the polysilicon gate electrode 4 of the driving transistor.

Among them, the first electrode layer is one of the anode layer and the cathode layer, and the second electrode layer is the other of the anode layer and the cathode layer.

In some embodiments, the base substrate 1 may specifically be a wafer.

The display substrate includes a display area B and a binding area A, in which the part of the first metal lead layer 6 located in the binding area A is the binding pin 7. For subsequent binding with the PCB and/or FPC, the binding pin 7 needs to be exposed.

In this embodiment, an encapsulation protection structure 14 surrounding the display area B of the display substrate is provided, thereby being capable of protecting the periphery of the display area and improving the reliability of the encapsulation. After the encapsulation layer is formed, and when the photoresist is burned in the binding area A, even if there is photoresist residue at the edge of the area burned by the laser, the compactness of the encapsulation can be guaranteed due to the existence of the encapsulation protection structure 14. In addition, if the encapsulation layer at the edge of the area burned by the laser is affected to generate cracks, the existence of the encapsulation protection structure 14 can still prevent water and oxygen from invading the display area B, thereby ensuring the compactness of the encapsulation.

As shown in FIG. 7, the display panel further includes a color filter layer 18 located on a surface of the first encapsulation layer 17 away from the base substrate 1, a second encapsulation layer 19 located on a surface of the color filter layer 18 away from the base substrate 1, and an encapsulation cover plate 20 located on a surface of the second encapsulation layer 19 away from the base substrate 1. The color filter layer 18 may include a plurality of filter units of different colors, such as a red filter unit R, a green filter unit G, and a blue filter unit B. The color filter layer 18 can realize the colorization of the light emitted from the display panel, thereby realizing the color display.

Among them, the first encapsulation layer 17 may be made of one or a combination of SiNX, $SiO_2$, organics, and $Al_2O_3$. In a specific example, the first encapsulation layer 17 may include a SiOx layer, an organic layer, and an $Al_2O_3$ layer that are stacked in sequence. The second encapsulation layer 19 may be made of one or a combination of SiNX, $SiO_2$, organics, and $Al_2O_3$. In a specific example, the second encapsulation layer 19 may include a SiOx layer, an organic layer, and an Al₂O₃ layer that are stacked in sequence. The encapsulation cover plate 20 may specifically be made of a glass cover plate.

In order to ensure the compactness of the encapsulation, the width S of the encapsulation protection structure 14 in the first direction may be greater than 1 μm, and the thickness of the encapsulation protection structure 14 may be in a range from 0.5 μm to 2.5 μm, in which the first direction is perpendicular to the extension direction of the encapsulation protection structure 14 and parallel to the base substrate 1.

The shape of the encapsulation protection structure 14 is a ring, as long as the encapsulation protection structure 14 can surround the display area B. Since the display area B is generally rectangular, the encapsulation protection structure 14 can be a square ring. Of course, the encapsulation protection structure 14 is not limited to a square ring, and other shapes are also possible.

The encapsulation protection structure 14 needs to be separated from the display area B at a certain distance. In some embodiments, a minimum distance d between an inner contour of an orthogonal projection of the encapsulation protection structure 14 on the base substrate 1 and an outer contour of an orthogonal projection of the display area B on the base substrate 1 can be greater than 100 μm. In addition, in order to ensure the narrow frame of the display panel, the value of d can be less than 200 μm.

Since the photoresist is formed in the binding area A before the light emitting layer is evaporated, the encapsulation protection structure 14 can also be made of a photoresist. Thus, the encapsulation protection structure 14 and the photoresist in the binding area A can be formed simultaneously through a single patterning process, and there is no need to add an additional patterning process to specifically prepare the encapsulation protection structure 14, thereby reducing the number of the patterning process for preparing the display panel. The encapsulation protection structure 14 may be made of a positive photoresist or a negative photoresist.

An embodiment of the present disclosure further provides a method for preparing a display panel, including:
providing a display substrate, in which the display substrate includes a base substrate, a driving transistor embedded on the base substrate, and a first electrode layer located on the base substrate and connected to a first electrode of the driving transistor;
forming an encapsulation protection structure surrounding a display area of the display substrate and an intermediate process structure comprising a photoresist covering a binding area of the display substrate;
forming a light emitting layer covering the display area and the binding area; and
forming a second electrode layer covering the display area and the binding area;
forming a first encapsulation layer covering the display area and the binding area; and
burning the intermediate process structure comprising the photoresist by a laser, such that the intermediate process structure comprising the photoresist explodes to expose the binding area after absorbing heat.

In this embodiment, an encapsulation protection structure 14 surrounding the display area B of the display substrate is provided, thereby being capable of protecting the periphery of the display area and improving the reliability of the encapsulation. After the encapsulation layer is formed, and when the photoresist is burned in the binding area A, even if there is photoresist residue at the edge of the area burned by the laser, the compactness of the encapsulation can be guaranteed due to the existence of the encapsulation protection structure 14. In addition, if the encapsulation layer at the edge of the area burned by the laser is affected to generate cracks, the existence of the encapsulation protection structure 14 can still prevent water and oxygen from invading the display area B, thereby ensuring the compactness of the encapsulation.

Figure 2:
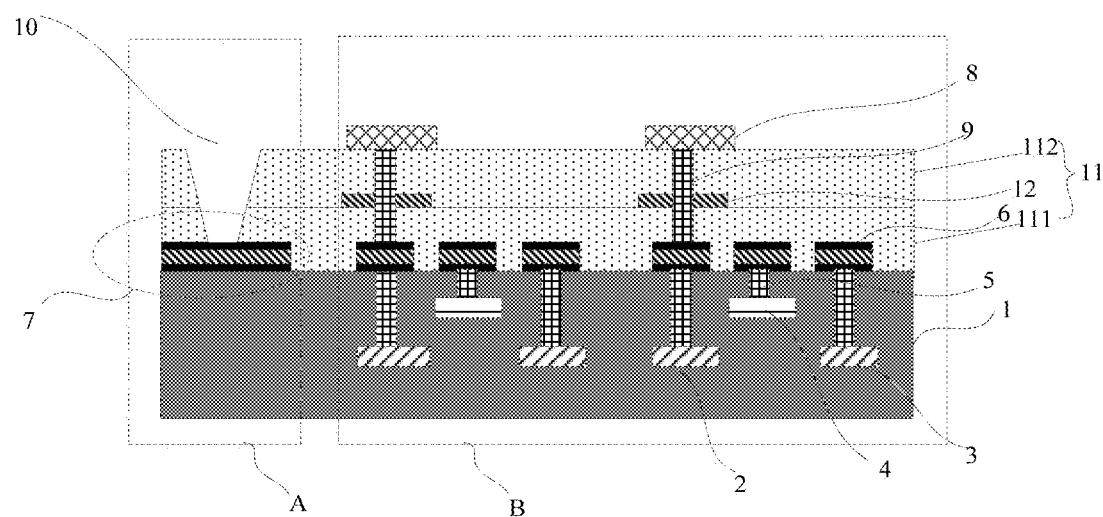
FIGS. 2 to 7 are schematic view showing the process for preparing the display panel according to the embodiments of the present disclosure.

In a specific embodiment, the method for preparing the display panel includes the following steps:

Step 1. As shown in FIG. 2, a multi-layer metal lead is formed on the base substrate 1, and the multi-layer metal lead includes a first metal lead layer 6.

Among them, FIG. 2 is a schematic cross-sectional view of FIG. 1 in the CC direction. FIG. 2 only shows the first metal lead layer 6 furthest from the base substrate 1, in which the first metal lead layer 6 is connected to the source electrode 2, the drain electrode 3 and the polysilicon gate electrode 4 of the driving transistor through the electrically conductive connecting line 5. The polysilicon gate 4 is one layer of polysilicon grown by the treatment of molecular beam epitaxy, which is conductive and can be used as the gate electrode of the thin film transistor.

The first electrode layer of the display panel is connected to the first electrode of the driving transistor through the first metal lead layer 6, in which the first electrode may be the source electrode 2, the drain electrode 3 and the polysilicon gate electrode 4 of the driving transistor.

In some embodiments, the base substrate 1 may specifically be a wafer.

The display substrate includes a display area B and a binding area A, in which the part of the first metal lead layer 6 located in the binding area A is the binding pin 7. For subsequent binding with the PCB and/or FPC, the binding pin 7 needs to be exposed.

The first metal lead 6 can be made of a metal with good electrical conductivity, and the thickness is generally in a range from 300 to 5000 angstroms, and specifically can be 350 angstroms.

Step 2. As shown in FIG. 2, a first insulation sublayer 111 covering the first metal lead layer 6 is formed.

The first insulation sublayer 111 may be made of silicon nitride, silicon oxide, or silicon oxynitride, and its thickness is in a range from 500 to 5000 angstroms.

Step 3. As shown in FIG. 2, a reflection pattern 12 is formed.

Since the anode pattern 8 of the display panel can be made of a light-transmitting material, in order to increase the light emitting efficiency, a reflective layer can be formed in the display area B of the display substrate. The reflective layer includes a plurality of mutually independent reflective patterns 12, in which the reflection pattern 12 corresponds to the anode pattern 8 of the display substrate in one-to-one manner. There is an overlapped area between the orthogonal projection of the reflective pattern 12 on the base substrate 1 and the orthogonal projection of the corresponding anode pattern 8 on the base substrate 1. The reflective pattern 12 can reflect the light transmitted through the anode pattern 8 to the light emitting side to increase the light emitting efficiency of the display panel. The reflective pattern 12 does not participate in electric conduction, and the position of the reflective pattern 12 needs to avoid the area where the via hole is to be formed.

Step 4. As shown in FIG. 2, a second insulation sublayer 112 is formed.

The second insulation sublayer 112 may be made of silicon nitride, silicon oxide, or silicon oxynitride, and the thickness may be set as need and specifically may be in a range from 1000 to 15000 angstroms.

Step 5. As shown in FIG. 2, the insulation layer 11 is etched to form a via hole 10 located in the binding area, and the via hole 10 exposes the binding pin 7.

Step 6. As shown in FIG. 2, anode pattern 8 is formed on the insulation layer 11.

Specifically, an anode material layer may be formed on the insulation layer 11, and the anode material layer may be patterned to form a plurality of mutually independent anode patterns 8 located in the display area B, in which each anode pattern 8 is connected to the first metal lead layer 6 through an electrically conductive pillar 9. The reflection pattern 12 corresponds to the anode pattern 8 in one-to-one manner, and an outer contour of an orthogonal projection of the reflection pattern 12 on the base substrate 1 may coincide with an outer contour of an orthogonal projection of the corresponding anode pattern 8 on the base substrate 1.

Figure 3:
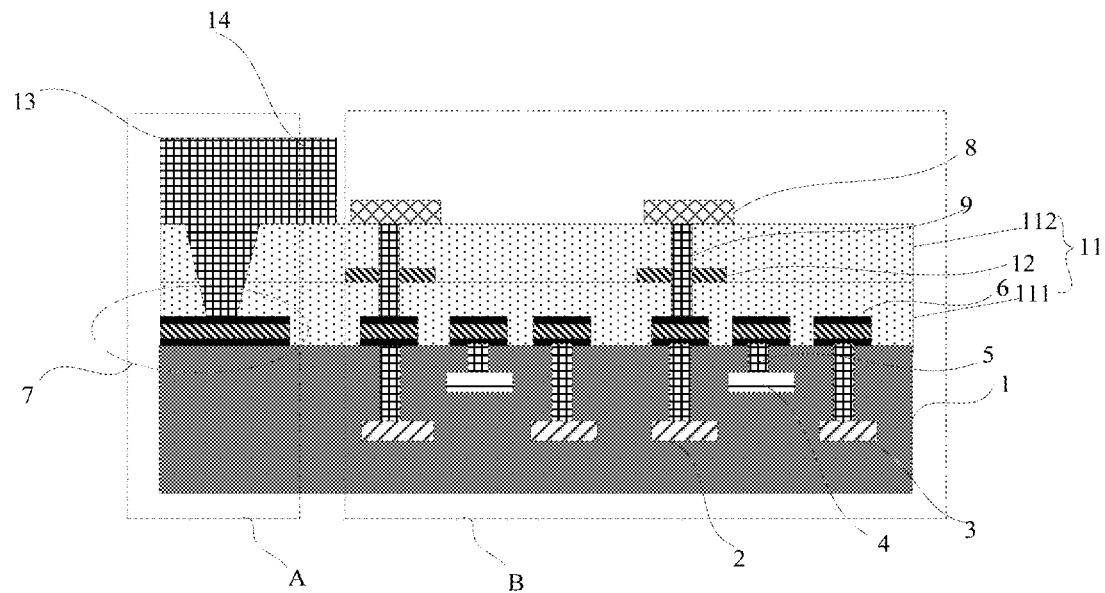

Step 7. As shown in FIG. 3, one layer of the photoresist is coated on the display substrate with the anode pattern 8, and the photoresist is exposed and developed to form an intermediate process structure comprising a photoresist 13 covering the binding area A and an encapsulation protection structure 14 surrounding the display area B.

Among them, FIG. 3 is a schematic cross-sectional view of FIG. 1 in the CC direction. The photoresist can be made of a positive photoresist or a negative photoresist, and the thickness of the photoresist can be in a range from 0.5 µm to 2.5 µm.

The intermediate process structure comprising the photoresist 13 and the encapsulation protection structure 14 may be configured into an integral structure, or may be separate.

In order to ensure the compactness of the encapsulation, as shown in FIG. 1, the width S of the encapsulation protection structure 14 in the first direction may be greater than 1 µm, and the thickness of the encapsulation protection structure 14 may be in a range from 0.5 µm to 2.5 µm, in which the first direction is perpendicular to the extension direction of the encapsulation protection structure 14 and parallel to the base substrate 1. The shape of the encapsulation protection structure 14 is a ring, as long as the encapsulation protection structure 14 can surround the display area B. Since the display area B is generally rectangular, the encapsulation protection structure 14 can be a square ring. Of course, the encapsulation protection structure 14 is not limited to a square ring.

The encapsulation protection structure 14 needs to be separated from the display area B at a certain distance. In some embodiments, a minimum distance d between an inner contour of an orthogonal projection of the encapsulation protection structure 14 on the base substrate 1 and an outer contour of an orthogonal projection of the display area B on the base substrate 1 can be greater than 100 µm. In addition, in order to ensure the narrow frame of the display panel, the value of d can be less than 200 µm.

The forming the intermediate process structure comprising the photoresist 13 and the encapsulation protection structure 14 through a single patterning process can strengthen and thicken the encapsulation layer without increasing the process procedure, thereby better isolating water and oxygen and being beneficial to the encapsulation reliability and life of the display device.

Figure 4:
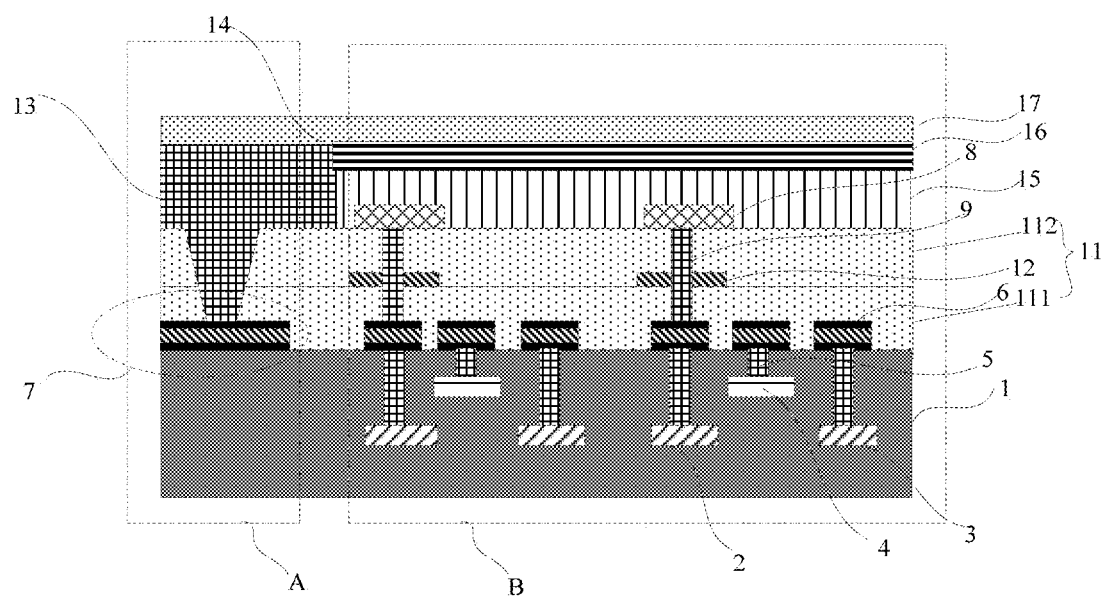

Step 8. As shown in FIG. 4, the light emitting layer 15, the second electrode layer 16, and the first encapsulation layer 17 are formed.

Among them, FIG. 4 is a schematic cross-sectional view of FIG. 1 in the CC direction. When the light emitting layer 15 is formed, an organic light emitting material is evaporated on the entire surface to form the light emitting layer 15.

The first encapsulation layer 17 covers the binding area A and the display area B, and may use one or a combination of SiNX, $SiO_2$, organic matter, and $Al_2O_3$. In a specific example, the first encapsulation layer 17 may include SiOx layer, an organic layer and $Al_2O_3$ layer that are stacked in sequence. The thickness of the first encapsulation layer 17 can be designed as need.

Figure 5:
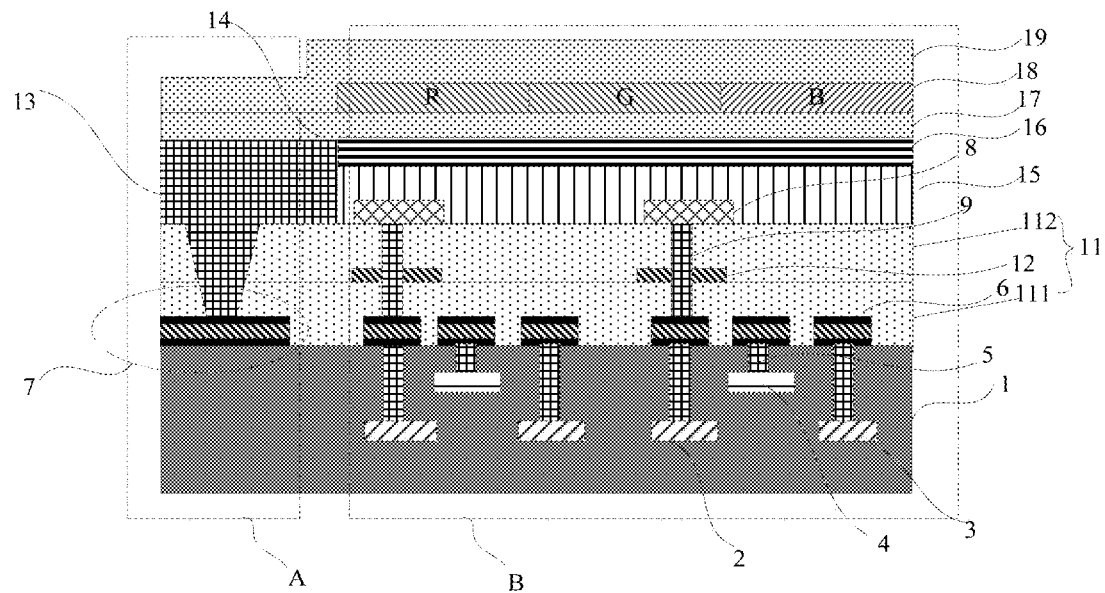

Step 9. As shown in FIG. 5, a color filter layer 18 and a second encapsulation layer 19 are formed.

Among them, FIG. 5 is a schematic cross-sectional view of FIG. 1 in the CC direction. The color filter layer 18 located in the display area B may include a plurality of filter units of different colors, such as a red filter unit R, a green filter unit G, and a blue filter unit B. The color filter layer 18 can realize the colorization of the light emitted from the display panel. The film forming order of the red filter unit R, the green filter unit G, and the blue filter unit B is not limited.

The second encapsulation layer 19 covers the binding area A and the display area B, and may use one or a combination of SiNX, $SiO_2$, organic matter, and $Al_2O_3$. In a specific example, the second encapsulation layer 19 may include SiOx layer, an organic layer and $Al_2O_3$ layer that are stacked in sequence. The thickness of the second encapsulation layer 19 can be designed as need.

Figure 6:
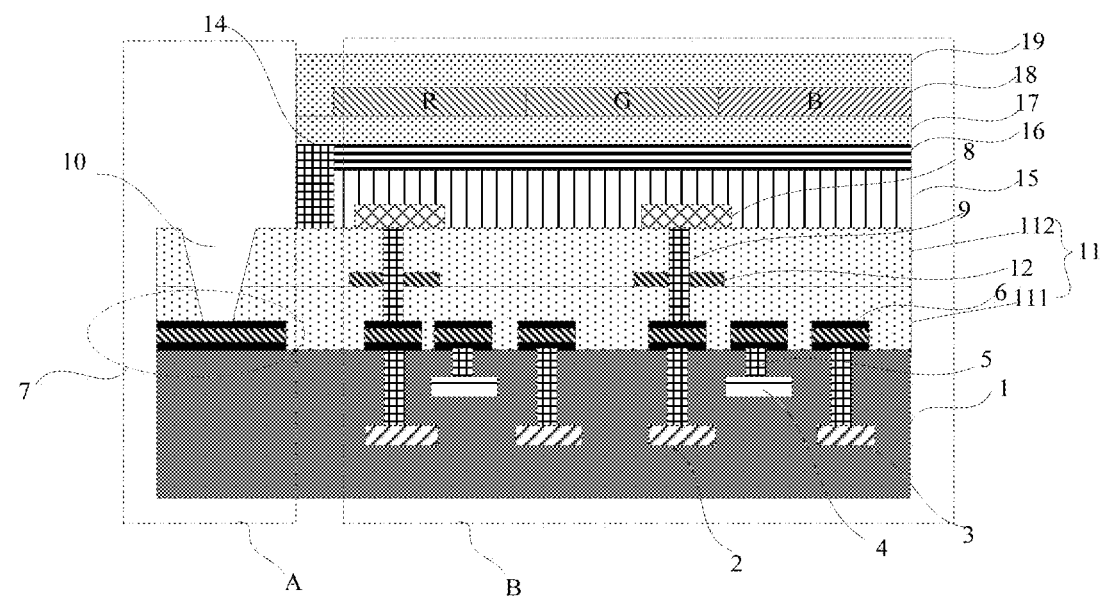

Step 10. As shown in FIG. 6, the intermediate process structure comprising the photoresist 13 of the binding area A is removed.

Among them, FIG. 6 is a schematic cross-sectional view of FIG. 1 in the CC direction. Specifically, the intermediate process structure comprising the photoresist 13 in the binding area can be burned by a laser to remove the intermediate process structure comprising the photoresist 13 and other film layers (including the first encapsulation layer 17 and the second encapsulation layer 19) above the binding area A. The wavelength of the laser light can be in a range from 235 nm to 550 nm. The intermediate process structure comprising the photoresist 13 has strong absorption to the laser light of this wavelength, and can explode after absorbing the heat of the laser, thereby exposing the binding pin 7 of the binding area.

In order to ensure the effective removal of the intermediate process structure comprising the photoresist 13 of the binding area A, the first orthogonal projection of the binding area A on the base substrate 1 is located within the spot of the laser, and a minimum distance between the outer contour of the first orthogonal projection and the outer contour of the spot is greater than 5 µm, thereby ensuring that the spot of the laser covers the binding area A. In addition, to avoid damage to other areas by the spot of the laser, the minimum distance between the outer contour of the first orthogonal projection and the outer contour of the spot is less than 10 µm.

Step 11. As shown in FIG. 7, an encapsulation cover plate 20 is formed.

Among them, the encapsulation cover plate 20 can be made of a glass cover.

After the above steps, the display panel can be obtained, and then the FPC and/or PCB are attached to the display panel to complete the preparation of the display device.

In this embodiment, when the intermediate process structure comprising the photoresist 13 of the binding area A is burned by the laser, the encapsulation protection structure 14 can protect the display area B to prevent the heat generated by the laser from affecting the display area. In addition, even if the first encapsulation layer 17 and the second encapsulation layer 19 at the edge of the area burned by the laser are affected to produce cracks, the encapsulation protection structure 14 can also protect the display area B, thereby preventing water and oxygen from invading the display area B, and ensuring the compactness of the encapsulation.

An embodiment of the present disclosure further provides a display device including the display panel as described above.

The display device includes but is not limited to: a radio frequency unit, a network module, an audio output unit, an input unit, a sensor, a display unit, an user input unit, an interface unit, a memory, a processor, a power supply and other components. Those skilled in the art would understand that the structure of the above display device does not constitute a limitation on the display device, and the display device may include more or less of the above components, or combine some components, or have different component arrangements. In the embodiments of the present disclosure, the display device includes, but is not limited to, a display, a mobile phone, a tablet computer, a television, a wearable electronic device, a navigation display device, and the like.

The display device may be any product or component having a display function, such as a television, a display, a digital photo frame, a mobile phone, a tablet computer, etc., in which the display device further includes a flexible circuit board, a printed circuit board, and a backplane.

In the method embodiments of the present disclosure, the serial numbers of the steps cannot be used to define the sequence of the steps. As for one skilled in the art, the changes in the order of steps without paying creative work also fall within the scope of the present disclosure.

It should be noted that the various embodiments in this specification are described in a progressive manner, and the same or similar portions between the various embodiments can be referred to each other, and each embodiment focuses on the differences from other embodiments. In particular, for the embodiment, since it is basically similar to the product embodiment, the description is relatively simple, and the relevant parts can be referred to a part of the description of the product embodiment.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

In the description of the above embodiments, the specific features, structures, materials or features may be combined in any suitable manner in any one or more embodiments or examples.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A method for preparing a display panel, comprising:
   providing a display substrate, the display substrate comprising a base substrate, a driving transistor embedded on the base substrate, and a first electrode layer located on the base substrate and connected to a first electrode of the driving transistor;
   forming an encapsulation protection structure surrounding a display area of the display substrate and an intermediate process structure comprising a photoresist covering a binding area of the display substrate;
   forming a light emitting layer covering the display area;
   forming a second electrode layer covering the display area;
   forming a first encapsulation layer covering the display area and the binding area; and
   burning the intermediate process structure comprising the photoresist by a laser, such that the intermediate process structure comprising the photoresist explodes to expose the binding area after absorbing heat.

2. The method of claim 1, wherein after the forming the first encapsulation layer, and before the burning the intermediate process structure comprising the photoresist by the laser, the method further comprises:
   forming a color filter layer covering the display area; and
   forming a second encapsulation layer covering the display area and the binding area.

3. The method of claim 1, wherein the forming the encapsulation protection structure and the intermediate process structure comprising the photoresist comprises:
   forming the encapsulation protection structure and the intermediate process structure comprising the photoresist through a single patterning process.

4. The method of claim 3, wherein the intermediate process structure comprising the photoresist and the encapsulation protection structure are configured into an integral structure.

5. The method of claim 1, wherein a first orthogonal projection of the binding area on the base substrate is located within a second orthogonal projection of the intermediate process structure comprising the photoresist on the base substrate, and a minimum distance between an outer contour of the first orthogonal projection and an outer contour of the second orthogonal projection is in a range from 5 μm to 10 μm.

6. The method of claim 1, wherein a wavelength of the laser is in a range from 235 nm to 550 nm.

7. The method of claim 1, wherein a first orthogonal projection of the binding area on the base substrate is located within a spot of the laser, and a minimum distance between an outer contour of the first orthogonal projection and an outer contour of the spot is in a range from 5 μm to 10 μm.

* * * * *